United States Patent
Soh et al.

(10) Patent No.: US 9,198,316 B2
(45) Date of Patent: Nov. 24, 2015

(54) ELECTRICAL WIRE JACKETING CONFIGURATION

(75) Inventors: Shutoh Soh, Makinohara (JP); Kenta Kamiya, Makinohara (JP); Kunihiko Takeuchi, Makinohara (JP); Takeshi Onoda, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/450,727

(22) Filed: Apr. 19, 2012

(65) Prior Publication Data

US 2012/0267140 A1 Oct. 25, 2012

(30) Foreign Application Priority Data

Apr. 20, 2011 (JP) ................................. 2011-093967

(51) Int. Cl.
*H02G 3/08* (2006.01)
*H05K 7/02* (2006.01)

(52) U.S. Cl.
CPC ...................................... *H05K 7/026* (2013.01)

(58) Field of Classification Search
USPC ......... 174/50, 21 R, 60, 68.1, 260, 261, 72 A, 174/74 A, 85, 93, 70 C, 102 SP, 61, 650, 174/54–59, 62–64, 89; 439/752.5
See application file for complete search history.

(56) References Cited

U.S. PATENT DOCUMENTS

| | | | |
|---|---|---|---|
| 5,035,654 A | 7/1991 | Endo | |
| 5,697,813 A | 12/1997 | Ikeda | |
| 5,993,268 A * | 11/1999 | Yamaguchi | ................. 439/752.5 |
| 2010/0267264 A1* | 10/2010 | Sawairi | .............. H01R 13/5219 439/271 |
| 2011/0250805 A1* | 10/2011 | Nishide | ................. H01R 13/113 439/888 |

FOREIGN PATENT DOCUMENTS

| | | |
|---|---|---|
| CN | 101867118 A | 10/2010 |
| JP | H3-4473 U | 1/1991 |

(Continued)

OTHER PUBLICATIONS

Office Action from the State Intellectual Property Office of the People's Republic of China dated Sep. 29, 2014 for parallel Chinese Application No. 201210117642.0.

(Continued)

*Primary Examiner* — Chau N Nguyen
*Assistant Examiner* — Paul McGee, III
(74) *Attorney, Agent, or Firm* — Locke Lord LLP (57) ABSTRACT

An electrical wire jacketing configuration used in an electrical junction box herein has a body portion in which a recess is formed. The electrical wire jacketing configuration includes a gutter-shaped portion configured to pass an electrical wire therethrough, a slidable engaging portion formed in both end portions of the gutter-shaped portion in the across-the-width-direction, and is slidingly engabeable with a guide portion of the recess, and a projection extending from the gutter-shaped portion toward the recess so as to prevent possible erroneous or wrong attachment of the electrical wire jacketing configuration to the recess. The recess may have a secondary guide portion configured to proceed the projection into the recess such that the projection can engage with the recess. The electrical wire jacketing configuration to which the electrical wire is fixed slidably moves toward the recess in a longitudinal direction of the electrical wire, and thereby mates with the recess.

2 Claims, 5 Drawing Sheets

(56) References Cited

FOREIGN PATENT DOCUMENTS

| | | |
|---|---|---|
| JP | H6-260238 A | 9/1994 |
| JP | H10-12309 A | 1/1998 |
| JP | 2006-320131 A | 11/2006 |
| JP | 2010-041808 A | 2/2010 |

OTHER PUBLICATIONS

Office Action mailed on Jun. 23, 2015 issued for corresponding Japanese Patent Application No. 2011-093967.

* cited by examiner

ELECTRICAL WIRE JACKETING CONFIGURATION

BACKGROUND OF THE INVENTION

1. Field of the Invention

The present application claims priority of Japanese Patent Application No. 2011-93967 filed on Apr. 20, 2011, the disclosure of which is expressly incorporated by reference herein in its entirety.

The invention relates to an electrical wire jacketing configuration enabling an electrical wire disposed inside electric junction box to slidably engage with the body portion of the electric junction box, with the electrical wire being fixed to the electrical wire jacketing configuration.

2. Description of the Related Art

Conventionally, a wide variety of electrical wire jacketing configurations for an electric junction box have been proposed for downwardly and outwardly leading a terminal-attached electrical wire along the electrical wire jacketing configuration which is slidingly attached to the recess formed in the side wall of the electric junction box.

In accordance with JP 2006-320131 (A) (not shown), a recessed groove is formed in the outer wall of the insulating resin body portion of an electric junction box; a terminal having an electrical wire attached thereto is connected to a connecting portion inside the body by screw fastening; left and right slidable engaging portions of a synthetic resin side cover (i.e., a cover for an electrical wire) slidably engage with left and right sliding grooves (i.e., guide portions) of the recessed groove; and the electrical wire having the terminal attached thereto is fixed via band to an intervening wall of the side cover. For more detail, see JP 2006-320131 (A), FIGS. 1 and 2.

In accordance with JP 2010-41808 (A) (not shown), a recess is formed in the side wall of synthetic resin case (i.e., body portion) of an electric junction box; a terminal having an electrical wire attached thereto is connected to a male-screw type terminal portion inside the case by means of screw fastening; left and right ribs (i.e., slidable engaging portions) of an electrical wire jacketing configuration slidably engages with left and right grooves (i.e., guide portions) of the recess; and the electrical wire having the terminal attached thereto is leaded along an arc-like guide groove of the electrical wire jacketing configuration. Subsequently, the electrical wire jacketing configuration is treated with elastic sheet for the prevention of water penetration. For more detail, see JP 2010-41808 (A), FIGS. 1, 6, and 12.

However, in the afore-mentioned conventional electrical wire jacketing configuration, in a case where the thickness of the guide portion of the recess formed in the body of the electric junction box or the slidable engaging portion of the electrical wire jacketing configuration is made relatively thin, the electrical wire jacketing configuration may be erroneously forced to mate with the recess in a horizontal direction by a worker or operator. However, in fact, the electrical wire jacketing configuration should be downward slided in a vertical direction so as to engage with the recess. Otherwise, even if the thickness of the slidable engaging portion or guide portion is enough, the electrical wire jacketing configuration may be erroneously forced to sidlingly mate with the recess, not in a vertical direction. In other words, one of the slidable engaging portions would incompletely mate with the guide portion. In this case, the slidable engaging portion of the electrical wire jacketing configuration and/or the guide portion of the recess may be damaged, or the electrical wire jacketing configuration may be deviated or disconnected from the afore-mentioned incomplete assembly.

Moreover, in order to fix or lock the electrical wire jacketing configuration to the recess of the body of the electric junction box, a locking means such as a locking arm, a locking piece and a locking projection must be formed in the electrical wire jacketing configuration. As a result, the electrical wire jacketing configuration becomes more complex, and a die for (resin) molding or forming such locking means becomes more complex, thus giving a cost-consuming job.

Furthermore, in order to prevent or protect liquid such as water from upward penetration into the electric junction box along an electrical wire having a terminal attached thereto, the use of elastic seal has been generally needed, thereby rendering the structure more complex and cost-consuming.

SUMMARY OF THE INVENTION

In light of the afore-mentioned drawbacks and problems, the present invention is provided.

In one aspect, the invention provides an electrical wire jacketing configuration used in an electrical junction box having a body portion in which a recess is formed. The electrical wire jacketing configuration includes a gutter-shaped portion configured to pass an electrical wire therethrough, a slidable engaging portion which is formed in both end portions of the gutter-shaped portion in an across-the-width-direction, and is slidingly engabeable with a guide portion of the recess, and a projection which extends from the gutter-shaped portion toward the recess so as to prevent possible erroneous or wrong attachment of the electrical wire jacketing configuration to the recess. The recess may have a secondary guide portion configured to proceed the projection into the recess such that the projection can engage with the recess. The electrical wire jacketing configuration to which the electrical wire is fixed slidably moves toward the recess in a longitudinal direction of the electrical wire, and thereby mates with the recess.

Preferably, the secondary guide portion may have a locking portion configured to lock the projection.

Preferably, the projection may have a wide portion and a narrow tip portion which may be locked with the locking portion.

Preferably, each of the gutter-shaped portion and the recess may have a curved inner surface corresponding to an outer periphery of the electrical wire, and the curved inner surface is in close contact with the outer periphery of the electrical wire such the body of the electric junction box is protected from external water invasion or penetration via the electrical wire.

BRIEF DESCRIPTION OF THE DRAWINGS

The invention may be put into practice in various ways and a number of embodiments will be described by way of example to illustrate the invention with reference to the accompanying drawings, in which.

DETAILED DESCRIPTION OF THE PREFERRED EMBODIMENTS

FIGS. 1-8 show one embodiment of an electrical wire jacketing configuration for an electric junction box in accordance with the invention.

Figure 1:
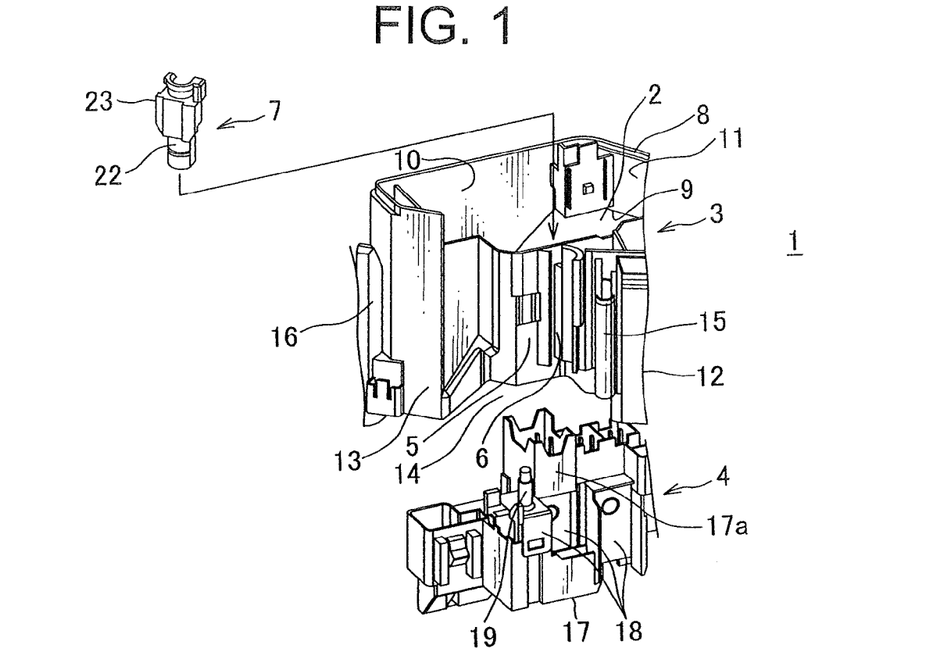
FIG. 1 is an exploded perspective view showing an embodiment of an electrical wire jacketing configuration of an electric junction box in accordance with the invention.

With reference to FIG. 1, an electric junction box 1 includes a frame 3 (i.e., a body of the electric junction box 1) formed of synthetic resin, having upper and lower openings 8, 9, and having an inner space 2, a connection block 4 inserted into the frame 3 from below the frame 3 in an upward direction, a side cover 7 (i.e., an electrical wire jacket or an electrical wire jacketing configuration) which is downwardly slided from above the frame 3 into and thus attached to an recess 6 which is formed in a vertical side wall 5 of the frame 3, an outer cover (not shown) which is formed of synthetic resin, and is slidably inserted from above the frame 3 so as to constitute a jacket for the side cover 7, an upper cover (not shown) formed of synthetic resin and configured to constitute a jacket for an upper opening 8 of the frame 3 and an upper opening inside the outer cover (i.e., an upper opening formed between the frame 3 and the outer cover), and an lower cover (not shown) formed of synthetic resin and configured to seal or close a lower opening 9 formed in the frame 3.

The frame 3 includes two side walls 10 and 11 which are at approximately right angles to each other, a short side walls 12 and 13 which respectively intersect with the side walls 10 and 11 or are respectively perpendicular to the side walls 10 and 11, and are respectively continuous with the side walls 10 and 11, and a side wall 5 disposed in an inwardly depressed or convex portion 14 between the short side walls 12 and 13. The above side walls 10 and 11, the short side walls 12 and 13, and the side wall 5 together constitute a circumferentially continuous peripheral wall. A vertically extending recess 6 is formed in the side wall 5, and is configured to mount the side cover 7 to the side wall 5. The recess 6 also extends through the side wall 5. The outer cover is to be mounted to slidable engaging portions 15 and 16 which vertically extend in the short side walls 12 and 13, respectively. The lower portion of the depressed or convex portion 14 is open to outside. In other words, the depressed or convex portion 14 has a lower opening which is also represented by a reference numeral 14.

The connection block 4 is shown to include a block body 17 formed of insulating resin, a bus bar 18 attached to the block body 17 and formed of conductive metal for the purpose of electric power supply, and an upwardly-extending male-type threading terminal 19 connected to the bus bar 18. The block body 17 has a portion for the attachment of a fusible link, and a portion for attachment of a relay.

A terminal having an electrical wire attached thereto (not shown) is connected to the male-type threading terminal 19 by nut fastening. An electrical wire having a terminal connected thereto 20 (see FIG. 2) is fixed to the side cover 7 by taping 21 and so on. In this situation, the side cover 7 is downwardly inserted from above the recess 6 into the recess 6 of the frame 3 in a slidable manner in vicinity of the male-type threading terminal 19.

Figure 2:
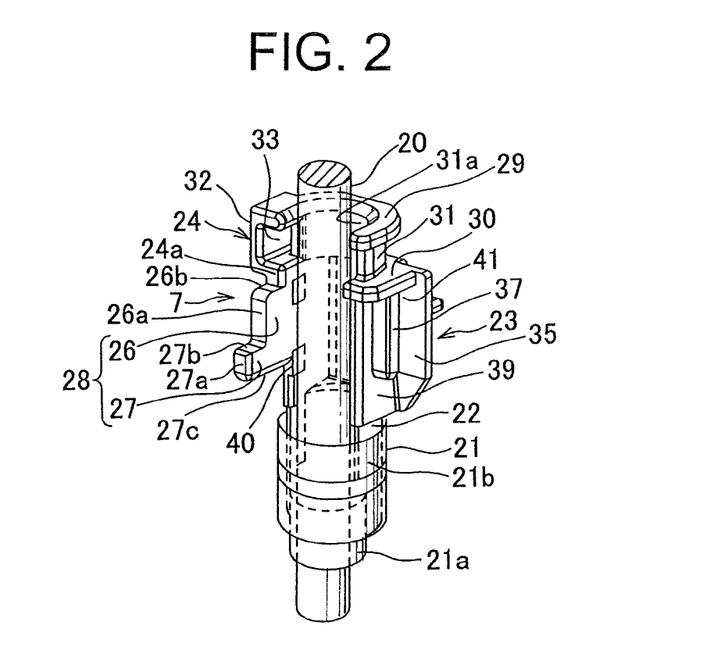
FIG. 2 is a perspective view showing an embodiment of an electrical wire jacketing configuration to which an electrical wire is fixed by taping.
Figure 3:
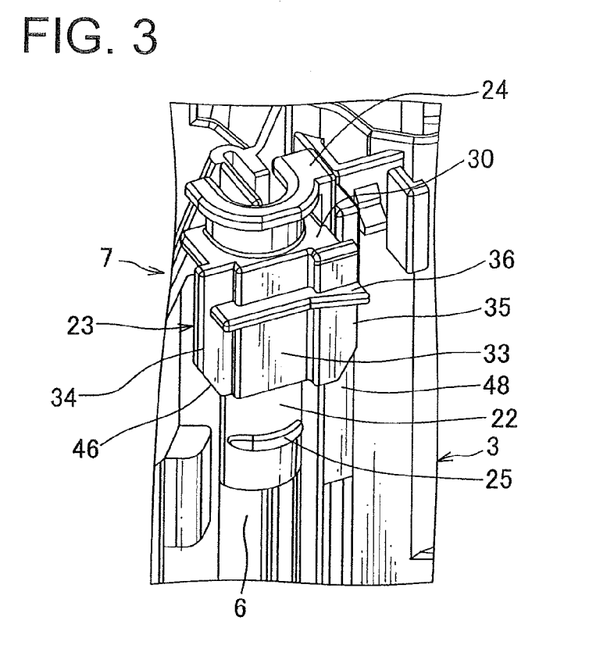
FIG. 3 is a perspective view of an embodiment of an electrical wire jacketing configuration which mates with a frame in a slidable manner.

Referring to FIGS. 1 to 3, the side cover 7 is vaulted (i.e., half-round), and is integrally fortified with a gutter-shaped portion 22 continuously extending from an upper end portion to a lower end portion, a slidable engaging portion 23 extending vertically and formed in the outer periphery (i.e., a front side) of the gutter-shaped portion 22 in the middle of the gutter-shaped portion 22 in a longitudinal direction (i.e., along a height of the gutter-shaped portion 22), and electrical wire-fixing portions 24, 25 respectively formed the upper and lower sides of the gutter-shaped portion 22. With reference to FIG. 2, the side cover 7 is also integrally formed with a relatively wide, rectangular-shaped vertical projecting wall 26 which projects from one of the side wall 40, which is disposed in the middle of the gutter-shaped portion 22 in its height direction, toward a portion or side opposite to or away from the slidable engaging portion 23 (i.e., toward rear side), and a relatively narrow, rectangular shaped accessory projection 27 which further extends from a lower half of the projecting wall 26 in a rearward direction. For more detail, the projecting wall 26 is a relatively greater width, and the accessory projection 27 is formed in the shape of relatively narrow (area) tip.

The projecting wall 26, which can be also called as a primary or main projection, and the accessory projection 27 cooperate with each other so as to form a projection 28 which is configured to prevent erroneous or wrong assembly. Moreover, the accessory projection 27 functions as a locking portion for the recess 6 of the frame 3. A vertical rear end surface (i.e., an apical surface) 26a of the projecting wall 26 is continuous with a rear end surface 24a of the upper electrical wire-fixing portion 24 via a horizontal stepped surface (i.e., an upper end surface) 26b, and a vertical rear end surface (i.e., an apical surface) 27a of the accessory projection 27 is continuous with a rear end surface 26a of the projecting wall 26 via a horizontal stepped surface (i.e., an upper end surface) 27b. In other words, the projecting wall 26 extends from the rear end surface 24a of the upper electrical wire-fixing portion 24 in a stepped fashion, and the accessory projection 27 is continuous with the projecting wall 26 in a stepped fashion. As such, due to the wide or broad (area) portion (i.e., the projecting wall 26) of the projection 28 wrong assembly of the electrical wire jacketing configuration is securely prevented, and due to the narrow (area) tip portion (i.e., the accessory projection 27) the locking portion can be securely locked.

The upper electrical wire-fixing portion 24 includes upper and lower horizontal (i.e., parallel) flanged walls 29, 30, a half-round peripheral or circumferential groove 31 extending between the upper and lower horizontal flanged walls 29, 30, a vertical wall 32 communicating with the upper and lower flanged wall 29, 30 above the projecting wall 26, and a hole extending through the vertical wall 32. In this configuration, the electrical wire 20 is fixed by coupling band (not shown). Referring to FIG. 3, the lower electrical wire-fixing portion 25 can be formed on the outer periphery of the gutter-shaped portion 22 in the shape of arc-like, horizontally extending (elongated) projection. Referring to FIG. 2, the electrical wire may be fixed to the lower electrical wire-fixing portion 25 by taping 21.

It is possible to fix the electrical wire 20 to the lower electrical wire-fixing portion 25 by means of mere tape or taping 21 without the use of the upper electrical wire-fixing portion 24 (in particular, the use of the vertical wall 32 and/or the hole 32 for passing or leading band therethrough). For example, after the outer periphery of the electrical wire 20 is wrapped with the tape 21 once (i.e., after the tape 21 is wound around the electrical wire 20 once), which is represented by a reference numeral 21a, the outer periphery of the gutter-shaped portion 22 and the outer periphery of the electrical wire 20 are bundled together with the tape 21, which is represented by a reference numeral 21b. The side cover 7 to which the electrical wire 20 is fixed slidably engages with the recess 6 of the frame 3.

With reference to FIG. 3, the slidable engaging portion 23 is formed in a shape of sheet or plate, and is perpendicular to the lower flanged wall 30. A plate-shaped portion 33 includes slidable plate portions 34, 35 which are respectively disposed in left and right sides of the plate-shaped portion 33. A horizontal operation plate 36 is disposed in the upper side of the plate-shaped portion 33. In accordance with one embodiment of the invention, the left and right slidable plate portions 34, 35 are disposed at different levels back and forth in conformity with the shape of the engaging or mating recess 6 of the frame 3.

Figure 5:
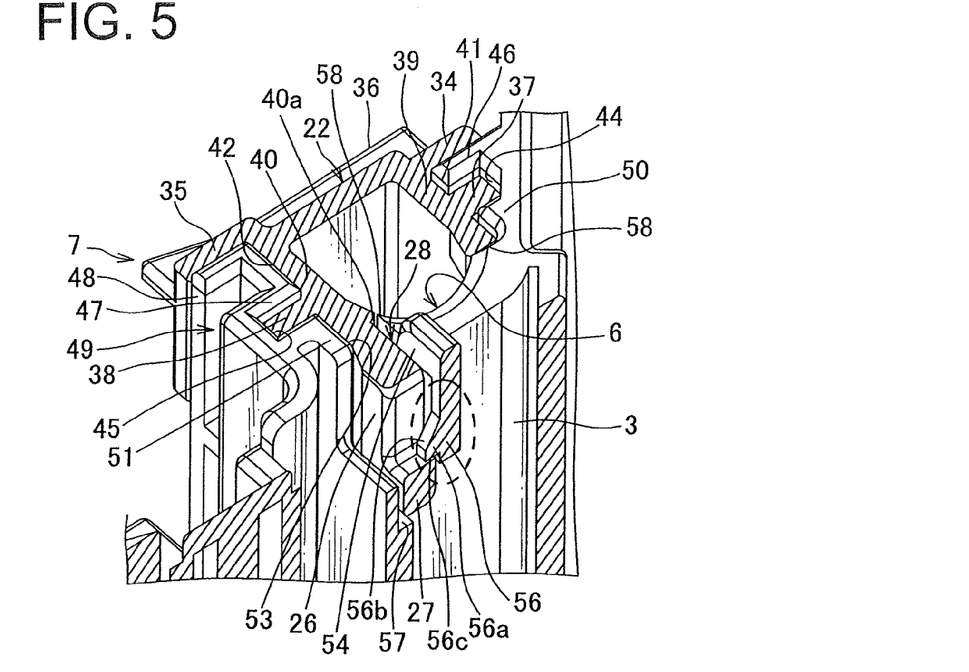
FIG. 5 is a partial cross-sectional perspective view showing an electrical wire jacketing configuration-and-frame assembly that the electrical wire jacketing configuration slidingly mates with the frame.

Referring to FIGS. 2 and 5, the rear surfaces of the left and right slidable plate portions 34, 35 are perpendicular to the outer surfaces of the left and right vertical side walls 39, 40 of the gutter-shaped portion 22. In the outer surfaces of the side walls 39, 40 there are provided vertical slidable ribs 37, 38 (see FIG. 5) which at least partly define the slidable engaging portion 23. The slidable ribs 37 and 38 are disposed in parallel with the slidable plate portions 34, 35. Between the slidable ribs 37, 38 and the slidable plate portions 34, 35 there are respectively provided vertical slidable grooves 41, 42.

The vertical length of slidable ribs 37, 38 is less than that of the slidable plate portions 34, 35. In other words, the slidable ribs 37, 38 are made shorter than the slidable plate portions 34, 35 in a vertical direction. The upper end portions of the slidable ribs 37, 38 are perpendicular to and continuous with the lower surface of the lower flanged wall 30. The lower end portions of the slidable ribs 37, 38 are located at the same level or height as the lower surface 27c (see FIG. 2) of the rear accessory projection 27 in the middle of the slidable plate portions 34, 35 in a height direction.

Figure 6:
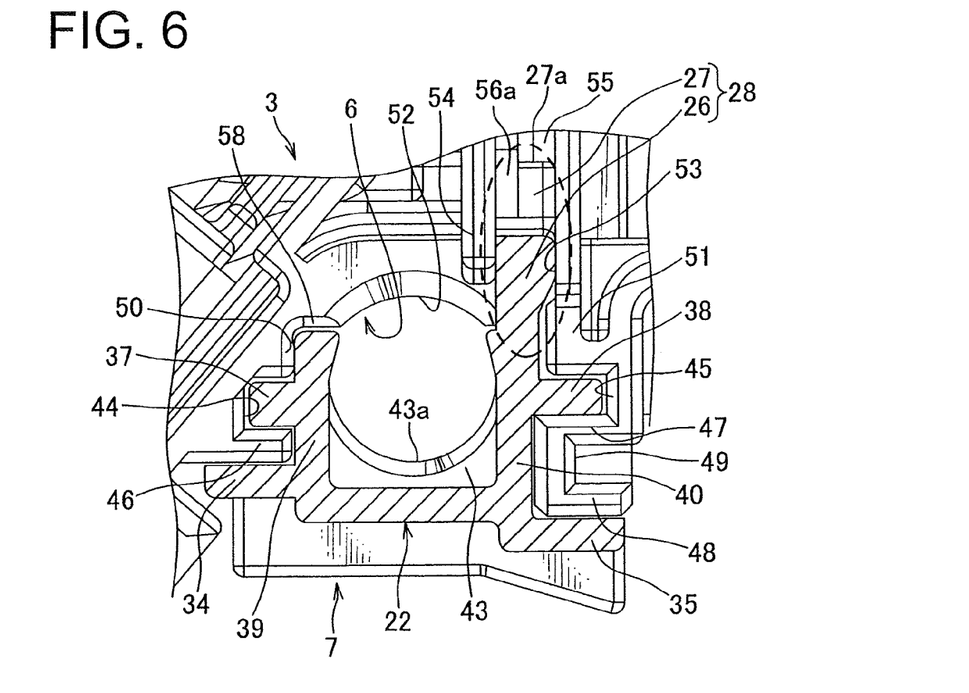
FIG. 6 is a partial plan view showing an electrical wire jacketing configuration-and-frame assembly that the electrical wire jacketing configuration slidingly mates with the frame.

With reference to FIG. 6, the inner surface (i.e., the inner periphery) of the gutter-shaped portion 22 has a rectangular-shaped cross section in the interior of the left and right vertical side walls 39, 40 of the gutter-shaped portion 22. On the other hand, the inner surfaces (i.e., the inner peripheries) 31a, 43a of the upper portion 31 (see FIG. 2) and the lower portion 43 of the gutter-shaped portion 22 have arc-like cross-sections in conformity with the cross-section of the electrical wire 20 (see FIG. 2).

Figure 4:
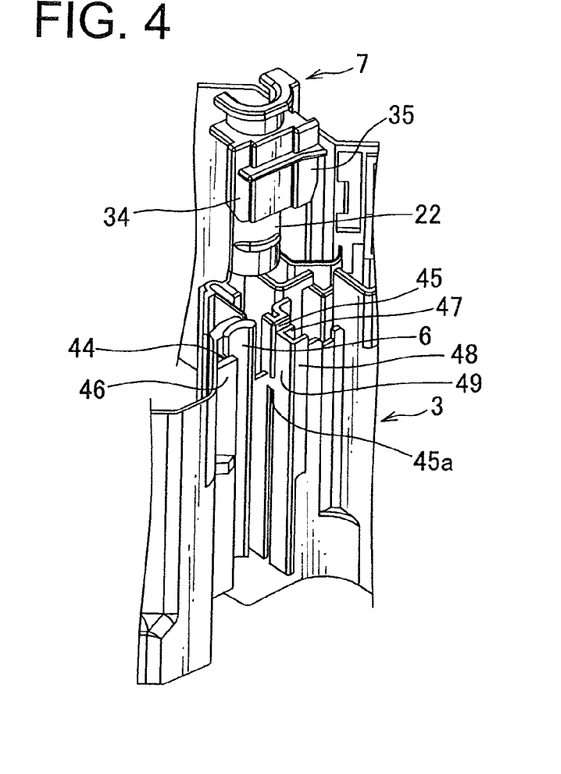
FIG. 4 is a perspective view of an embodiment of an electrical wire jacketing configuration-and-frame assembly before an electrical wire jacketing configuration slidingly mates with a frame.

As shown in FIGS. 4 to 6, the recess or recessed groove 6 of the frame 3 has left and right vertical guide grooves (i.e., guide portions) 44, 45 which are opposed to each other. There are also provided vertically-elongated rib-shaped guide walls (i.e., guide portions) 46, 47 in front of the left and right guide grooves 44, 45. In accordance with the embodiment, the right guide wall 47 at least partly defines an wall portion 49 having a U-shaped cross-section, and the front wall 48 of the wall portion 49 constitutes a vertically extending elongated rib-shaped guide wall (i.e., guide portion) (48). The guide grooves 44, 45 are respectively located behind and adjacent to the guide walls 46, 47.

With reference to FIGS. 5 and 6, the left and right slidable ribs 37, 38 of the side cover 7 slidably engage with the left and right guide grooves 44 and 45 in a downward direction. Inside the grooves 44 and 45, there are respectively provided horizontal stopper walls 44a, 45a (see FIG. 7) which are configured to make the lower end portions of the slidable ribs 37, 38 abut. The inner surfaces (i.e., rear surfaces) of the slidable plate portions 34, 35 of the side cover 7 slidingly contact the outer surfaces (i.e., the front surfaces) of the left guide wall 46 and the right front end guide wall 48, respectively. The front surfaces of the slidable ribs 37, 38 slidingly contact the inner surfaces (i.e., rear surfaces) of the left guide wall 46 and the right middle guide wall 47, respectively.

The rear surfaces of the grooves 44, 45 are perpendicular to the rear short walls 50, 51 which shortly extend in an antero-posterior direction. The short walls 50, 51 are continuous with a curved surface 52 which is located rearward of the recess 6. The curved surface 52 may be also designated as a "rear curved surface" hereinafter. The curved surface 52 has an arc-like cross section in conformity with the cross section of the outer periphery of the electrical wire 20 (see FIG. 2), which is inserted into and passes through the curved surface 52.

There is provided a notch in one side of the curved surface 52. In accordance with the shown embodiment of the invention, the notch is provided in the right side of the curved surface 52. For more detail, the notch is formed in a direction in which a rear, secondary guide groove 53 (i.e., a guide portion or a secondary guide portion) is perpendicular to the left and right guide grooves 44, 45. In other words, the notch extends rearward. The rear, secondary guide groove 53 is not surrounded on three sides by guide walls, as the left and right guide grooves 44, 45. Guide walls 53, 54, which respectively reside in the left and right sides of the guide groove 53, are opposed to each other. The rear side of the rear guide groove 53 communicates with the rear narrow space 55 which is defined in the frame 3.

In one wall 54 defining the rear space 55, there is provided flexible locking piece (i.e., a locking portion) 56, which is notched by a slit of an approximately U-shaped form and is integrally formed with the wall 54. In accordance with the shown embodiment of the invention, the wall 54 is left side wall 54. In the lower end portion of the locking piece 56, there is provided an outwardly extending projection (i.e., a locking projection) 56a which extends to the rear space 55. The locking projection 56a has an upper inclined surface 56b and lower horizontal locking surface 56c. A stopper wall 57 is formed in the rear guide groove 53 such that it has the same level or height as the stopper walls 44a, 45a (see FIG. 4).

The rear projection 28 of the side cover 7 proceeds into and engages with the rear guide groove 53. Subsequently, the accessory projection 27 of the projection 28 engages with the locking piece 56. The accessory projection 27 also functions as a locking portion. As the side cover 7 slidingly engages with the recess 6 from above the recess 6 in a downward direction, due to the accessory projection 27 the locking piece 56 is made bent to the left side. As a result, the accessory projection 27 overcomes the locking projection 56a, and simultaneously the locking piece 56 elastically restores.

Accordingly, the locking projection 56a abut against and engages with the upper surface of the accessory projection 27, and the lower end surfaces of the slidable ribs 37, 38, and the projection 28 abut against the stopper walls 44a, 45a, and 57, respectively.

The end or tip surface (i.e., rear end surface) of the left and right side walls 39, 40 of the gutter-shaped portion 22 of the side cover 7 abuts against the left and right side walls (i.e., wall surfaces) 58 which is located on the near side of the curved surface 52 of the recess 6. The locking piece 56 can be disengaged from the accessory projection 27 by simple operation. For example, one can insert a slim flat-blade screwdriver from the above into the locking piece 56a and press the locking projection 56a such that the locking projection 56a is inwardly bent. As such, the locking piece 56 can be disengaged from the accessory projection 27.

Referring to FIG. 3, the upper electrical wire-fixing portion 24 extends toward above the recess 6 with the side cover 7 completely engaging with the recess 6 of the frame 3 in a slidable manner. In this state, the lower surface of the lower flanged wall 30 abuts against the upper end of the side walls 46, 47 (see FIG. 5), and the inner surfaces of the left and right slidable plate portions 34 and 35 are in contact with the outer surfaces of the left and right guide walls 46, 48.

Referring to FIG. 6, the projection 28 rearwardly extends beyond the rear curved surface 52 of the recess 6 with the side cover 7 completely mating with the recess 6 of the frame 3. In other words, the projection 28 projects or extends from the lower end surface 40a of the one side wall 40 such that the projection (i.e., the degree of the projection) is longer than horizontal length or distance between the lower end surface 40a of the one side wall 40 of the gutter-shaped portion 22 and the rear curved surface 52 of the recess 6.

Figure 7:
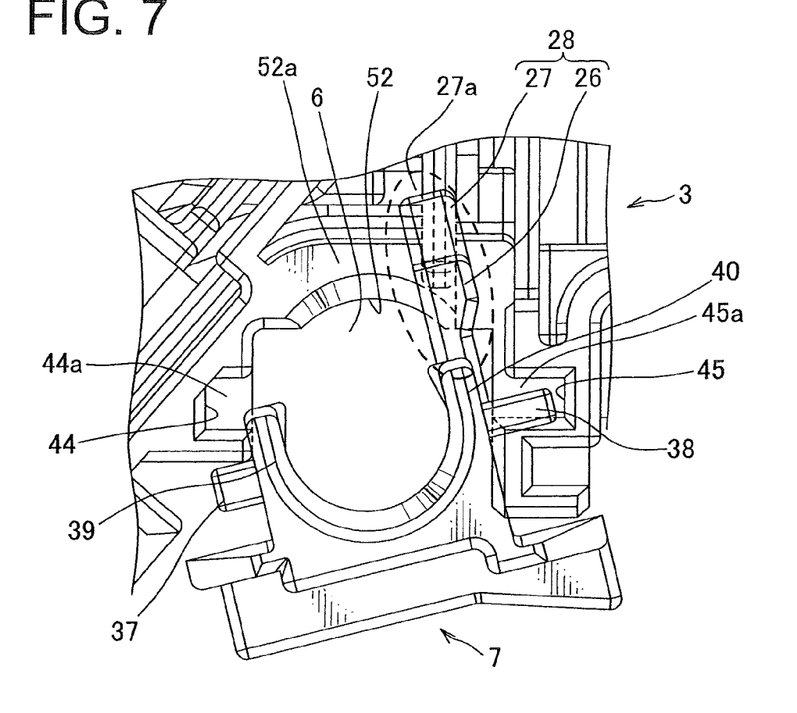
FIG. 7 is a plan view showing an erroneous or wrong assembly of an electrical wire jacketing configuration.

Referring to FIG. 7, if a worker erroneously forces the side cover 7 to attach to the recess 6 from the front side in a rearward direction, the tip portion (i.e., the end portion) 27a of the projection 28 abuts against the rear curved surface 52 of the recess 6, thereby preventing or protecting wrong assembly. Correctly, the side cover 7 should be slidably attached or mounted to the recess 6 from above the recess 6 in a downward direction.

Furthermore, as shown in FIG. 7, in a case where the side cover 7 is forced to slidably engage with the recess 6 from above the recess 6 in a downward direction with being circumferentially inclined, even if one of the slidable rib 38 engages with one of the guide groove 45, the lower surface 27c (see FIG. 2) of the projection 28 abuts against the upper end surface 52a of the rear wall 52 of the recess 6, thereby preventing further slidable engagement between the side cover 7 and the recess 6. As such, erroneous or wrong attachment of the side cover 7 to the recess 6 can be securely prevented.

Figure 8:
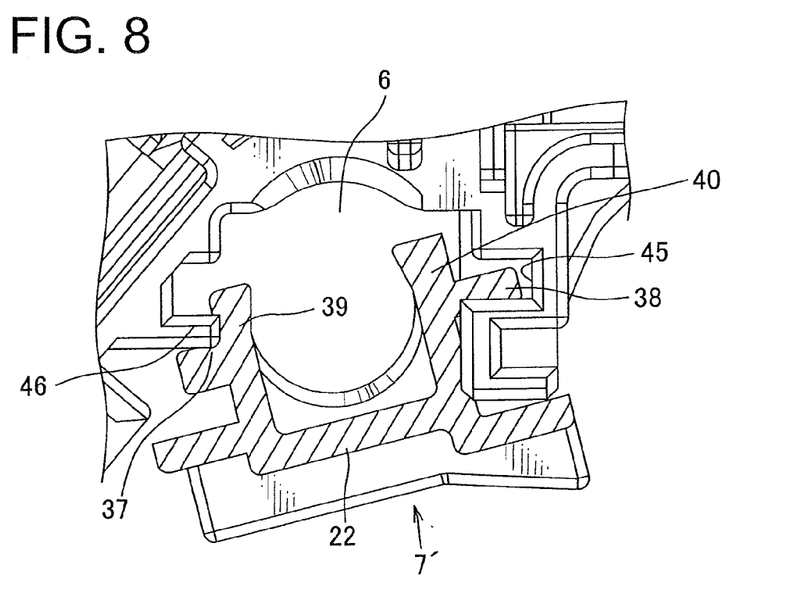
FIG. 8 is a partial cross-sectional plan view of wrong assembly of frame and electrical wire jacketing configuration which does not have any feature or component for preventing wrong assembly.

For reference, FIG. 8 shows a state in which a side cover 7' having no projection 28 is erroneously attached or mounted to the recess 6. In detail, the side cover 7' is sidlingly attached or mounted to the recess 6. When the side cover 7' is forced to sidlingly mate with the recess 6, one of the slidable ribs 38 of the side cover 7' mates with one of the grooves 45, and the other slidable rib 37 and the side wall 39 of the gutter-shaped portion 22 elastically abut against the guide wall 46, it seems as if the side cover 7' is attached to the recess 6.

In order to eliminate the above problem or drawback, there is provided the projection 28 in either of the side walls 39, 40 of the gutter-shaped portion 22 of the side cover 7'. In detail, either of the side walls 39, 40 has the projection 28 partly extending therefrom. Due to the presence of such a projection 28 wrong assembly of the side cover 7' can be securely prevented. When the projection 28 is disposed in one side portion of the gutter-shaped portion 22, a larger or wider space passing the electrical wire therethrough is ensured in comparison with a case where the projection 28 is formed in the middle of the gutter-shaped portion 22 in the across-the-width-direction. Moreover, by using a part of the projection 28 (i.e., the accessory projection 27) as a locking portion for the frame 3, the structure of the side cover 7 can be further simplified, thus allowing less cost consuming production.

Figure 9:
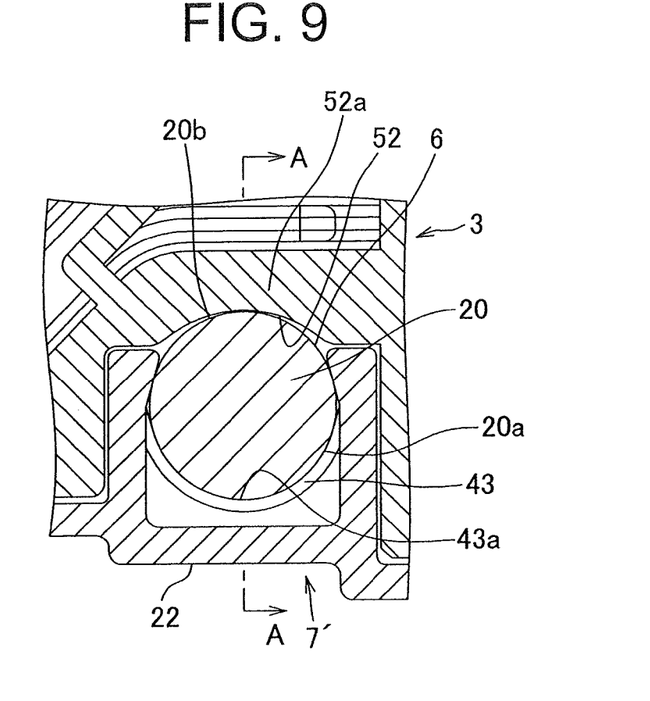
FIG. 9 is a plan view showing an electrical wire jacketing configuration-and-frame assembly that the electrical wire jacketing configuration normally or correctly mates with the frame.
Figure 10:
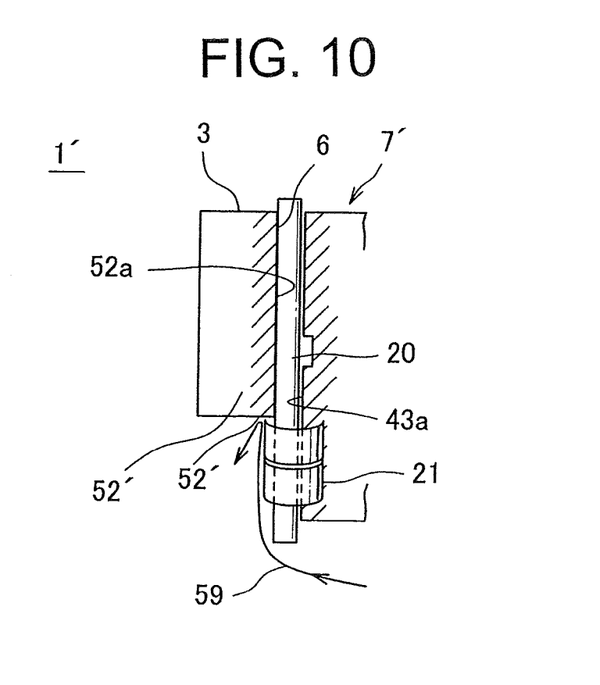
FIG. 10 is a cross-sectional view taken along line A-A of FIG. 9 for illustrating waterproof properties of an embodiment of an electrical wire jacketing configuration in accordance with the invention.

With reference to FIG. 9, a side cover 7' does not have any projection 28. In accordance with the shown embodiment, the inner diameter of the upper and lower walls 43 having an arc-like cross section of the gutter-shaped portion 22 can be made substantially equal to the outer diameter of the electrical wire 20, and the inner peripheries 31a, 43a of the gutter-shaped portion 22 is in close contact with the front side of the electrical wire 20 and the both left and right outer peripheries 20a. For reference, the electrical wire 20 will be inserted into and pass through the inner diameter of the upper and lower walls 43 of the gutter-shaped portion 22. Moreover, the inner diameter of the rear curved wall 52 of the recess 6 of the frame 3 can be made substantially equal to the outer diameter of the electrical wire 20, and the inner periphery 52 of the rear wall portion 52a is in close contact with the rear outer periphery 20b of the electrical wire 20. For reference, the inner periphery 52 of the rear wall portion 52a has an arc-like cross section. As such, as shown in FIG. 10, inside an electric junction box 1' disposed in an engine room, the water 59 which moves upward along the electrical wire 20 bounces off the lower end surface 52a' of the wall portion 52' of the recess 6 of the frame 3. As a result, the water moves downward. As such, further upward penetration or entrance of water into the electric junction box 1' can be effectively suppressed or prevented. Accordingly, waterproof properties are enhanced.

The above can be also applied to the side cover 7 having the projection 28. When the inner peripheries (i.e., the inner surfaces) of the side cover 7, and the recess 6 of the frame 3 comes in close contact with the outer periphery of the electrical wire 20, upward penetration or entrance of water into the electric junction box along the electrical wire 20 can be effectively prevented without using other waterproof components such as waterproof sheet and packing. Accordingly, waterproof structure can be obtained as a less complex and less cost-consuming structure.

While in accordance with the afore-mentioned embodiment of the invention the guide grooves 44, 45 and the guide walls 46, 48 are used as the guide portion, and the slidable plate portions 34, 35 and the slidable ribs 37, 38 are used as a slidable engaging portion, any modification or variation to the guide portion and the slidable engaging portion can be possible, if necessary.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:
1. An electrical wire jacketing configuration used in an electrical junction box, comprising:

a gutter-shaped portion configured to pass an electrical wire therethrough, a slidable engaging portion formed in both end portions of the gutter-shaped portion in an across-the-width-direction, and being slidingly engageable with a guide portion of a recess formed in a body of the electric junction box; and a projection extending from the gutter-shaped portion toward the recess so as to prevent possible erroneous or wrong attachment of the electrical wire jacketing configuration to the recess, wherein the recess has a secondary guide portion configured to proceed the projection into the recess such that the projection can engage with the recess, and wherein the electrical wire jacketing configuration to which the electrical wire is fixed slidably moves toward the recess in a longitudinal direction of the electrical wire and thereby mates with the recess, wherein the secondary guide portion has a locking portion configured to engage and lock the projection, the projection has a narrow portion and a wide portion, the narrow portion and the wide portion continuing stepwise in this order from a side on which the projection proceeds into the recess in a longitudinal direction of the electrical wire, and an extent of projection of the narrow portion is greater than that of the wide portion, whereas the locking portion has a locking projection projecting into the secondary guide portion so that the locking projection engages and locks the narrow portion.

2. The electrical wire jacketing configuration according to claim 1, wherein each of the gutter-shaped portion and the recess has a curved inner surface corresponding to an outer periphery of the electrical wire, and wherein the curved inner surface is in close contact with the outer periphery of the electrical wire so as to prevent external water penetration into the body of the electric junction box along the electrical wire.

* * * * *